(12) United States Patent
Horng et al.

(10) Patent No.: US 9,804,220 B2
(45) Date of Patent: Oct. 31, 2017

(54) DEVICE TESTING AND MONITORING METHOD THEREOF

(71) Applicant: TAIWAN SEMICONDUCTOR MANUFACTURING COMPANY LTD., Hsinchu (TW)

(72) Inventors: Jaw-Juinn Horng, Hsinchu (TW); Szu-Lin Liu, Hsinchu (TW); Jinn-Yeh Chien, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 224 days.

(21) Appl. No.: 14/714,635

(22) Filed: May 18, 2015

(65) Prior Publication Data

US 2016/0146881 A1    May 26, 2016

Related U.S. Application Data

(60) Provisional application No. 62/084,964, filed on Nov. 26, 2014.

(51) Int. Cl.
*G01R 31/26* (2014.01)

(52) U.S. Cl.
CPC ................... *G01R 31/2646* (2013.01)

(58) Field of Classification Search
CPC .... G01R 29/26; G01R 29/0814; G01R 23/00; G01R 31/002; G01R 31/31709; G01R 31/2646
See application file for complete search history.

(56) References Cited

U.S. PATENT DOCUMENTS

| | | | | |
|---|---|---|---|---|
| 2007/0032976 | A1* | 2/2007 | Rzyski | G01R 29/26 702/111 |
| 2010/0097151 | A1* | 4/2010 | Arai | H03F 1/3247 331/25 |
| 2013/0197848 | A1* | 8/2013 | Sariaslani | G01R 29/26 702/111 |
| 2015/0016616 | A1* | 1/2015 | Roth | G01R 29/26 381/56 |
| 2016/0305999 | A1* | 10/2016 | Li | G01R 29/26 |
| 2016/0315601 | A1* | 10/2016 | Gu | G01R 31/31709 |

\* cited by examiner

*Primary Examiner* — Jermele M Hollington
*Assistant Examiner* — Suresh K Rajaputra
(74) *Attorney, Agent, or Firm* — WPAT, P.C., Intellectual Property Attorneys; Anthony King

(57) ABSTRACT

Some embodiments of the present disclosure provide a method including turning on a noise-measuring system for a device under test (DUT) with the DUT turned off; measuring a first phase noise caused by the noise-measuring system; turning on the DUT; measuring a second phase noise caused by the noise-measuring system and the DUT; and subtracting the first phase noise from the second phase noise to obtain a third phase noise caused by the DUT.

20 Claims, 14 Drawing Sheets

DEVICE TESTING AND MONITORING METHOD THEREOF

PRIORITY CLAIM AND CROSS-REFERENCE

This application claims the benefit of provisional application Ser. 62/084,964 filed on Nov. 26, 2014, entitled "DEVICE TESTING AND MONITORING METHOD THEREOF," the disclosure of which is hereby incorporated by reference in its entirety.

BACKGROUND

Maintaining a high yield in semiconductor fabrication processes is increasingly important for decreasing the costs of fabrication. The continuous development of higher integration and miniaturization increase the complexity of controlling fabrication conditions to satisfy specification with high yield.

Techniques for measuring a device noise are useful to obtain performance metrics of a device. There are several types of noises exhibited by the device such as thermal noise, shot noise and flicker noise. Among them, flicker noise varies inversely with frequency and is the largest contributing factor to phase noise in a circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
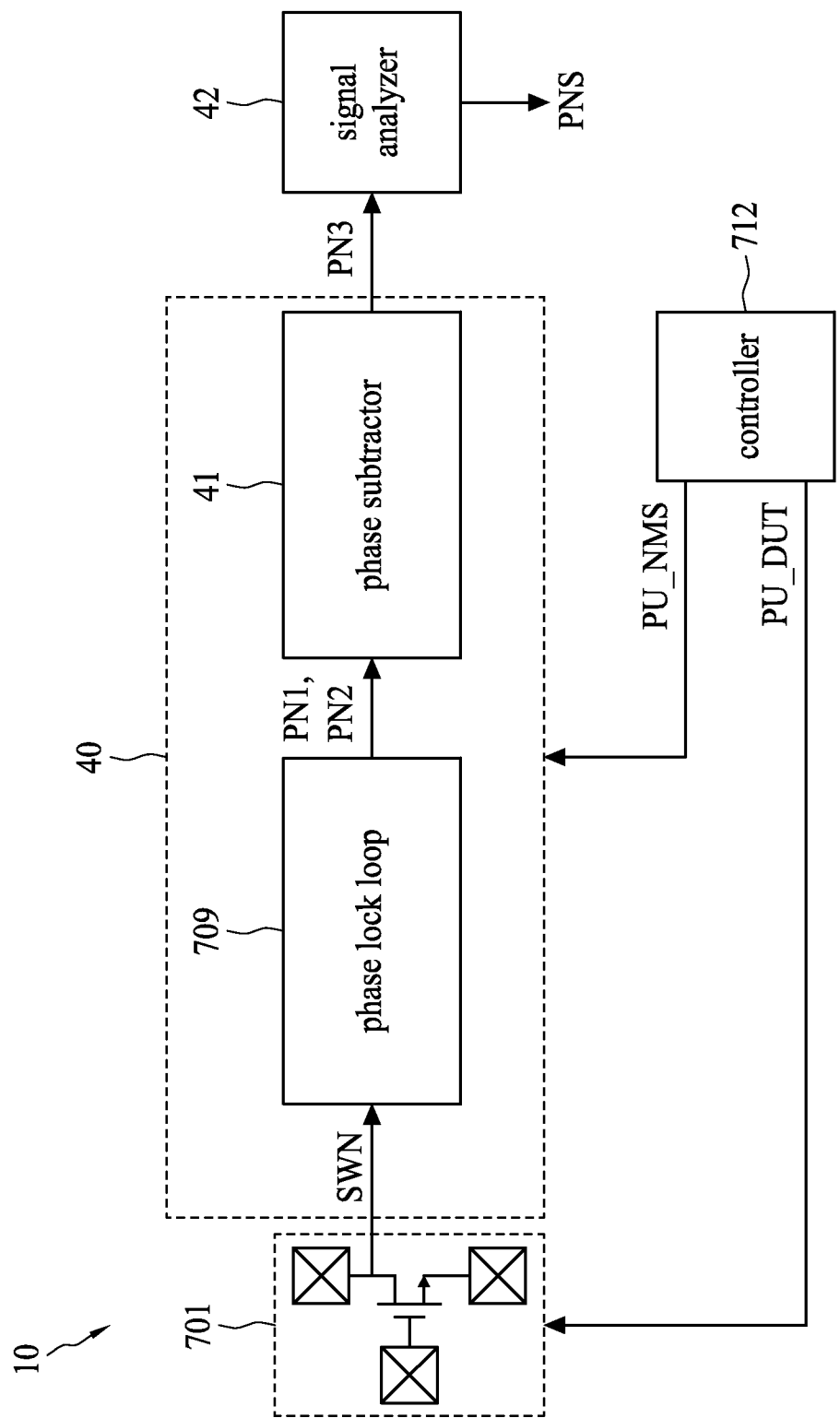
FIG. 1 is a block diagram for obtaining a phase noise spectrum of a device under test (DUT), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of a system 10 for obtaining a phase noise spectrum PNS of a device under test (DUT) 701 in accordance with some embodiments. The system 10 includes a noise-measuring system 40, a controller 712 and a signal analyzer 42. The noise-measuring system 40 includes a phase lock loop (PLL) 709, and a phase subtractor 41. The controller 712 is configured to turn on/off the noise-measuring system 40 via signals PU_NMS and the DUT 701 via a signal PU_DUT. The DUT 701 is configured to generate a signal with noise SWN to the PLL 709. The PLL 709 is configured to generate a phase noise PN1 with the DUT 701 turned off and a phase noise PN2 with the DUT 701 turned on in sequence to the phase subtractor 41. In some embodiments, a phase noise is a time-dependent fluctuation in a phase angle of an oscillator signal. The phase subtractor 41 is configured to receive and store the phase noise PN1 from the PLL 709, receive the phase noise PN2 from the PLL 709 and perform phase subtraction on the phase noise PN1 and phase noise PN2 to generate a phase noise PN3. The phase subtractor 41 sends the phase noise PN3 to the signal analyzer 42. The signal analyzer 42 is configured to receive and analyze the phase noise PN3 to generate the phase noise spectrum PNS.

Figure 2:
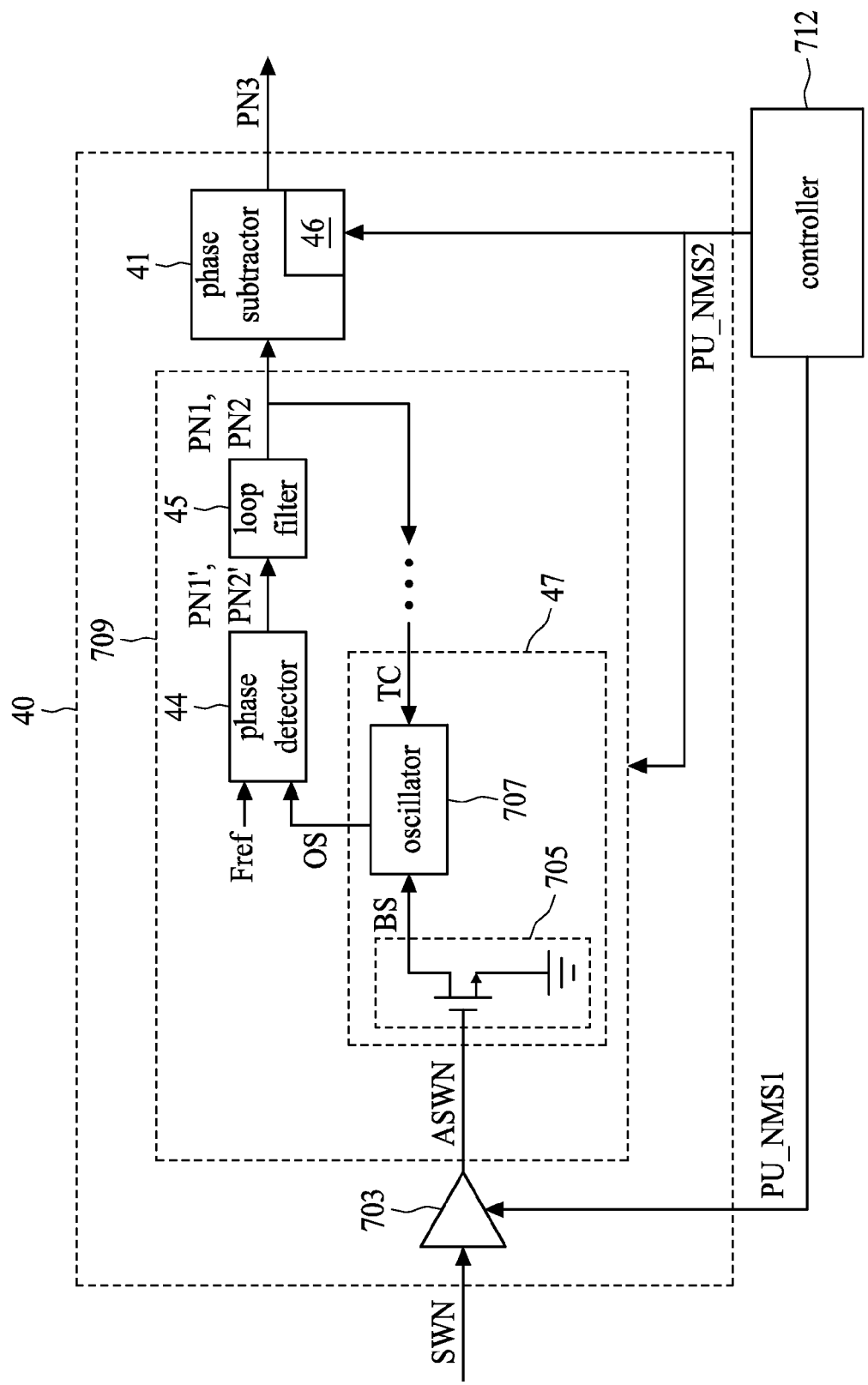
FIG. 2 is a block diagram of the noise-measuring system 40 controlled by the controller 712 in the system in FIG. 1, in accordance with some embodiments.

FIG. 2 is a block diagram of the noise-measuring system 40 controlled by the controller 712 in the system 10 in FIG. 1 in accordance with some embodiments. In FIG. 2, in some embodiments, the noise-measuring system 40 further includes an amplifier 703. The PLL 709 includes a modulator 705, an oscillator 707, a phase detector 44 and a loop filter 45. In some embodiments, the PLL 709 is an all-digital phase lock loop (ADPLL). The oscillator 707 is combined with the modulator 705 to be a bias-modulated oscillator. In some embodiments, the amplifier 703 is a low noise amplifier (LNA). The controller 712 is configured to turn on/off the DUT 701 (shown in FIG. 1), the amplifier 703, the PLL 709, and the phase subtractor 41. The phase subtractor 41 includes a storage element 46.

To measure the phase noise PN1 caused by the noise-measuring system 40, the noise-measuring system 40 is turned on while the DUT 701 (shown in FIG. 1) is turned off. In some embodiments, the controller 712 is configured to turn on the amplifier 703 via a signal PU_NMS1 of the signals PU_NMS in FIG. 1 and turn on the PLL 45 via a signal PU_NMS2 of the signals PU_NMS in FIG. 1. The modulator 705 is configured to generate the bias signal BS maintained at a substantially constant phase when the DUT 701 is turned off and send the bias signal BS to the oscillator 707. The oscillator 707 is configured to generate an oscillator signal OS in response to the bias signal BS and the tuning code TC and output the oscillator signal OS to the phase detector 44. The phase detector 44 is configured to detect the phase noise PN1' of the oscillator signal OS with respect to a reference signal Fref and output the phase noise PN1' to the loop filter 45. The loop filter 45 is configured to filter out certain bandwidth in the phase noise PN1' and output a filtered phase noise PN1. The filtered phase noise PN1 controls generation of a tuning code TC fed back to the oscillator 707. In response to the tuning code TC, the oscillator 707 is configured to generate the oscillator signal OS that tracks the reference signal Fref. The storage element 46 of the phase subtractor 41 is configured to store the filtered phase noise PN1 from the loop filter 45. In other embodiments, the storage element 46 is configured to store the phase noise PN1' from the phase detector 44.

To measure the phase noise PN2 caused by the noise-measuring system 40 and the DUT 701, the DUT 701 is turned on subsequent to the noise-measuring system 40. In some embodiments, the controller 712 is configured to turn on the DUT 701 via the signal PU_DUT in FIG. 1. The DUT 701 is configured to generate the signal with noise SWN. In some embodiments, the signal with noise SWN has a carrier frequency Fx. The amplifier 703 is configured to amplify the signal SWN to generate an amplified signal with noise ASWN. The modulator 705 is configured to generate the bias signal BS in response to the amplified signal with noise ASWN. In some embodiments, the modulator 705 includes an NMOS which is configured to generate the bias signal BS at its drain in response to a bias at its gate. In some embodiments, the bias signal BS is a current bias. The oscillator 707 is configured to generate the oscillator signal OS in response to the bias signal BS and the tuning code TC and output the oscillator signal OS to the phase detector 44. The phase of the oscillator signal OS is modulated by the amplified signal with noise ASWN. The phase detector 44 is configured to detect the phase noise PN2' of the oscillator signal OS with respect to the reference signal Fref and output the phase noise PN2' to the loop filter 45. The loop filter 45 is configured to filter out certain bandwidth in the phase noise PN2'. The phase subtractor 41 is configured to subtract the phase noise PN1 from the phase noise PN2 to generate the phase noise PN3 and output the phase noise PN3 to the signal analyzer 42 (shown in FIG. 1). The phase noise PN3 is the extracted phase noise of the DUT 701. In some embodiments, the phase subtractor 41 is a mixer. The signal analyzer 42 is configured to generate a phase noise spectrum PNS of the phase noise PN3.

In some embodiments, the DUT 701 and the noise-measuring system 40 in FIG. 1 are implemented on the same chip to avoid noise interference from environment.

Figure 3:
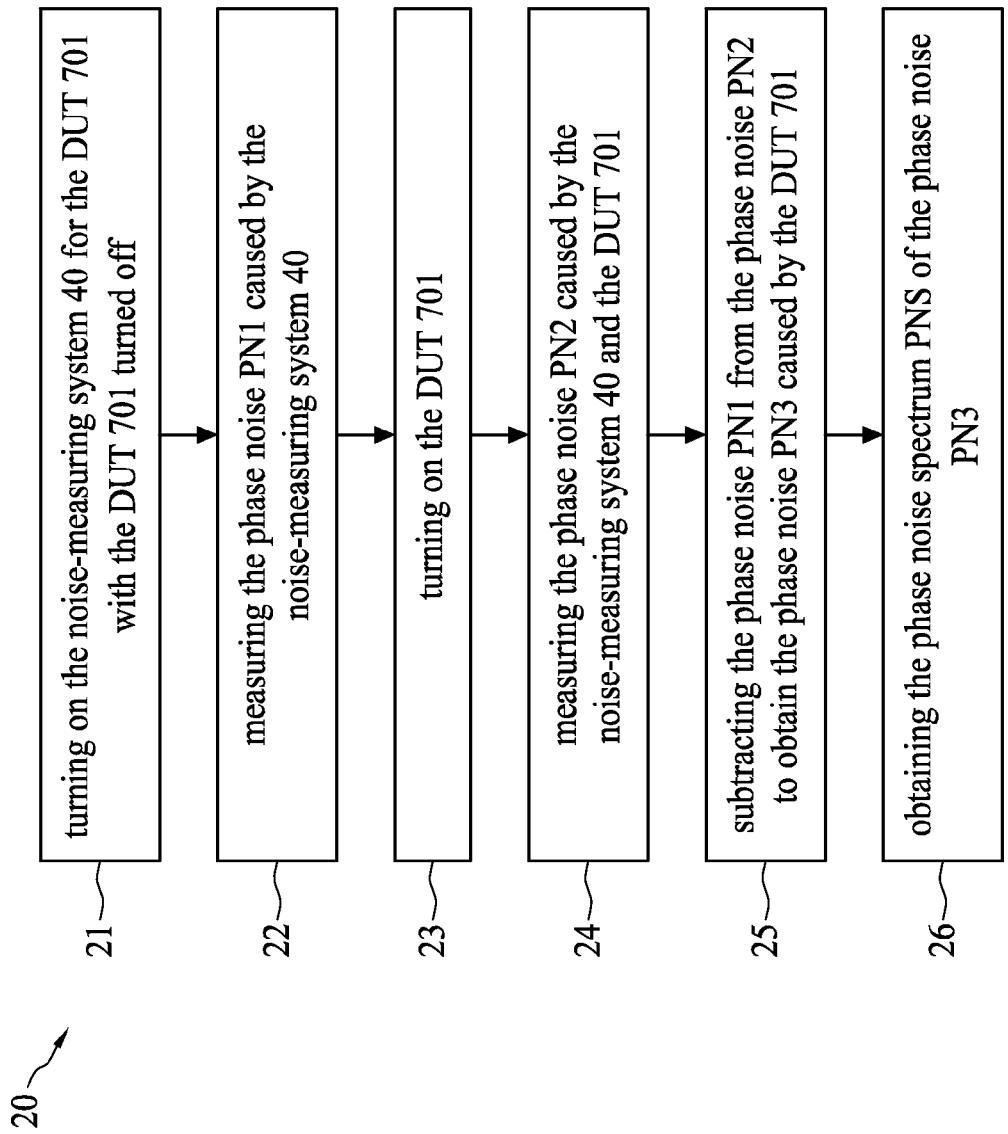
FIG. 3 is a flow diagram of a method for obtaining a phase noise spectrum of the DUT performed by the system in FIG. 1, in accordance with some embodiments.

FIG. 3 is a flow diagram of a method 20 for obtaining the phase noise spectrum PNS of the DUT 701 performed by the system 10 in FIG. 1 in accordance with some embodiments. Refer to FIGS. 1 to 3.

In operation 21, the controller 712 turns on the noise-measuring system 40 for the DUT 701 while turning off the DUT 701. The controller 712 turns on the amplifier 703 via the signal PU_NMS1 and turns on the PLL 709 and the phase subtractor 41 via the signal PU_NMS2.

In operation 22, the noise-measuring system 40 measures the phase noise PN1 caused by the noise-measuring system 40. The modulator 705 generates the bias signal BS maintained at the substantially constant phase. The oscillator 707 generates the oscillator signal OS that has only the phase noise of amplifier 703 and the PLL 45 in response to the bias signal BS and the tuning code TC. The phase detector 44 detects the phase noise PN1' of the oscillator signal OS with respect to the reference signal Fref. The loop filter 45 filters the phase noise PN1' to generate the filtered phase noise PN1 with a limited bandwidth. The filtered phase noise PN1 is used to update the tuning code TC of the oscillator 707. The frequency of the oscillator signal OS is tuned by the tuning code TC until the PLL 45 locks to a frequency corresponding to the reference frequency Fref. Then, the phase noise PN1 detected and filtered is sent to the storage element 46 of the phase subtractor 41 for storage.

In operation 23, the controller 712 turns on the DUT 701. The controller 712 turns on the DUT 701 via the signal PU_DUT.

In operation 24, the noise-measuring system 40 measures the phase noise PN2 caused by the noise-measuring system 40 and the DUT 701. The DUT 701 generates the signal with noise SWN. The amplifier 703 amplifies the signal SWN to generate the amplified signal with noise ASWN. The modulator 705 generates the bias signal BS in response to the amplified signal with noise ASWN. The oscillator 707 generates the oscillator signal OS in response to the bias signal BS and the tuning code TC. The phase detector 44 detects the phase noise PN2' of the oscillator signal OS with respect to the reference signal Fref. The loop filter 45 filters the phase noise PN2' to generate the filtered phase noise PN2 with a limited bandwidth. The filtered phase noise PN2 is used to update the tuning code TC of the oscillator 707. The frequency of the oscillator signal OS is tuned by the tuning code TC until the PLL 45 locks to a frequency corresponding to the reference frequency Fref. Then, the phase noise PN2 detected and filtered is sent to the phase subtractor 41.

In operation 25, the phase subtractor 41 subtracts the phase noise PN1 from the phase noise PN2 to obtain the phase noise PN3 caused by the DUT 701. The phase subtractor 41 subtracts the phase noise PN1 stored in the storage element 46 from the phase noise PN2 received from the PLL 45 to obtain the phase noise PN3 caused by the DUT 701.

In operation 26, the signal analyzer 42 obtains the phase noise spectrum PNS of the phase noise PN3. The phase noise spectrum PNS is exemplarily shown in FIG. 4.

Figure 4:
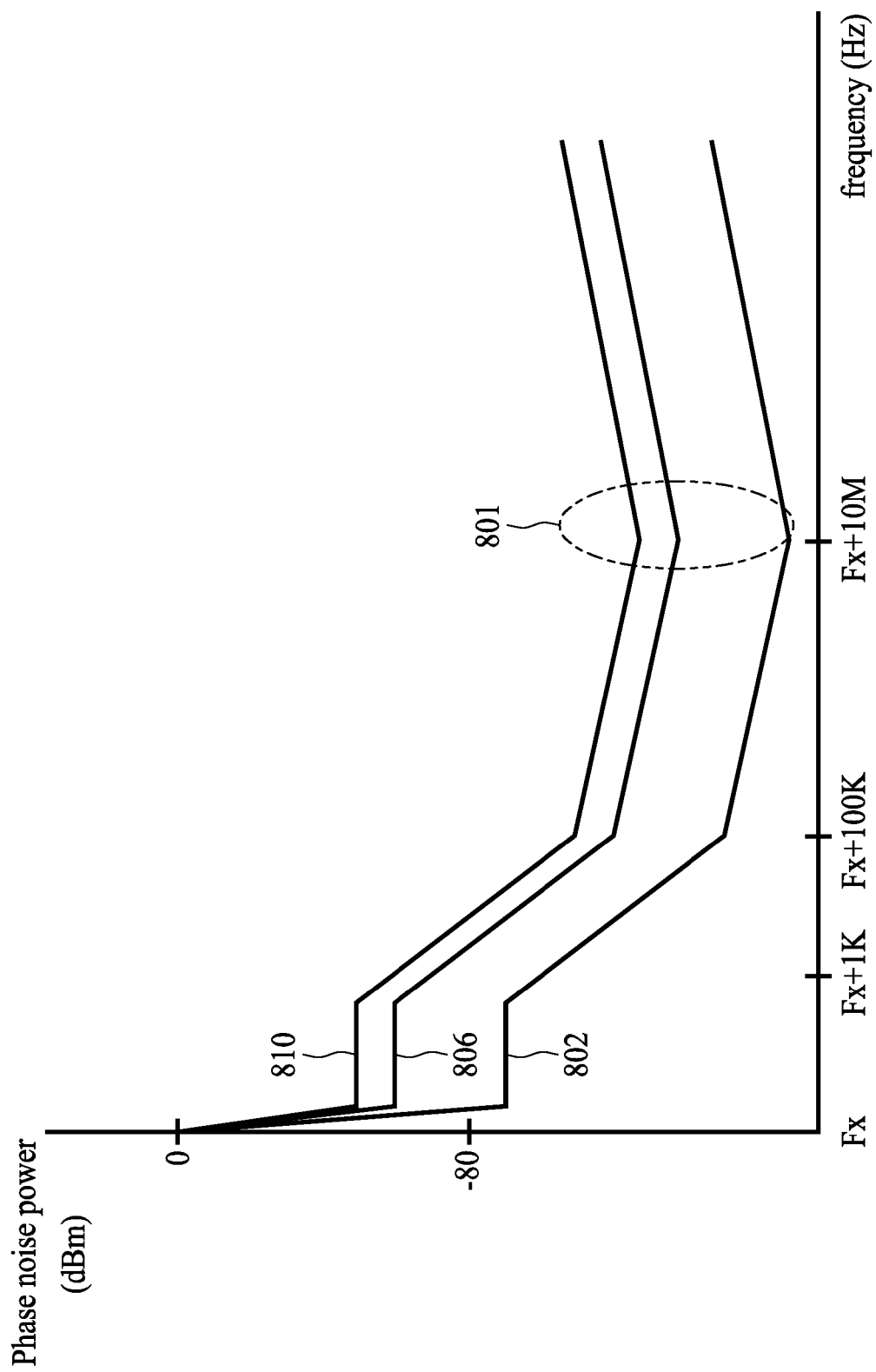
FIG. 4 is a diagram illustrating phase noise spectra of the phase noise of the noise-measuring system and the DUT, in accordance with some embodiments.

FIG. 4 is a diagram illustrating phase noise spectra of the phase noise of the noise-measuring system 40 and the DUT 701, the phase noise of the noise-measuring system 40 and the phase noise of the DUT 701 in accordance with some embodiments. Referring to FIGS. 1, 2 and 4, the phase noise spectrum PNS obtained by the signal analyzer 42 is the phase noise spectrum 802. In order to illustrate the phase noise PN3 being extracted from the phase noise PN1 and the phase noise PN2, the phase noise spectrum 806 of the phase noise PN1 and the phase noise spectrum 810 of the phase noise PN2 are shown in FIG. 4. The phase noise spectrum 806 with only the noise-measuring system 40 turned on has smaller magnitudes of phase noise power compared to the phase noise spectrum 810 with both the noise-measuring system 40 and the DUT 701 turned on. After the phase noise PN1 is eliminated from the phase noise PN2, the phase noise spectrum 802 of the phase noise PN3 has only the phase noise power of the DUT 701 remain and has significantly lower magnitudes. Thus, over-design of the DUT 701 or a circuit employing the DUT 701 to overcome interference of noise resulted from process corner variation is improved, thereby reducing chip area.

In some embodiments, a phase noise spectrum expresses magnitudes of power of phase noise at some offset frequencies from the carrier frequency Fx. In some embodiments, the carrier frequency Fx of the phase noise spectra is the carrier frequency Fx of the signal with noise SWN generated by the DUT 701. In some embodiments, the carrier frequency Fx of the phase noise spectra is also the frequency of the reference signal Fref. For frequencies smaller than a corner frequency at 10 MHz offset from the carrier frequency Fx, the flicker noise dominates, and the phase noise power of the phase noise spectra 802, 806 and 810 decreases with the increase of the frequency. At the corner frequency, the phase noise spectra 802, 806 and 810 exhibits turning points 801 of downward trends. For frequencies larger than the corner frequency, the thermal noise dominates, and the phase noise power of the phase noise spectra 802, 806 and 810 increases or remains substantially constant with the increase of the frequency.

Figure 5:
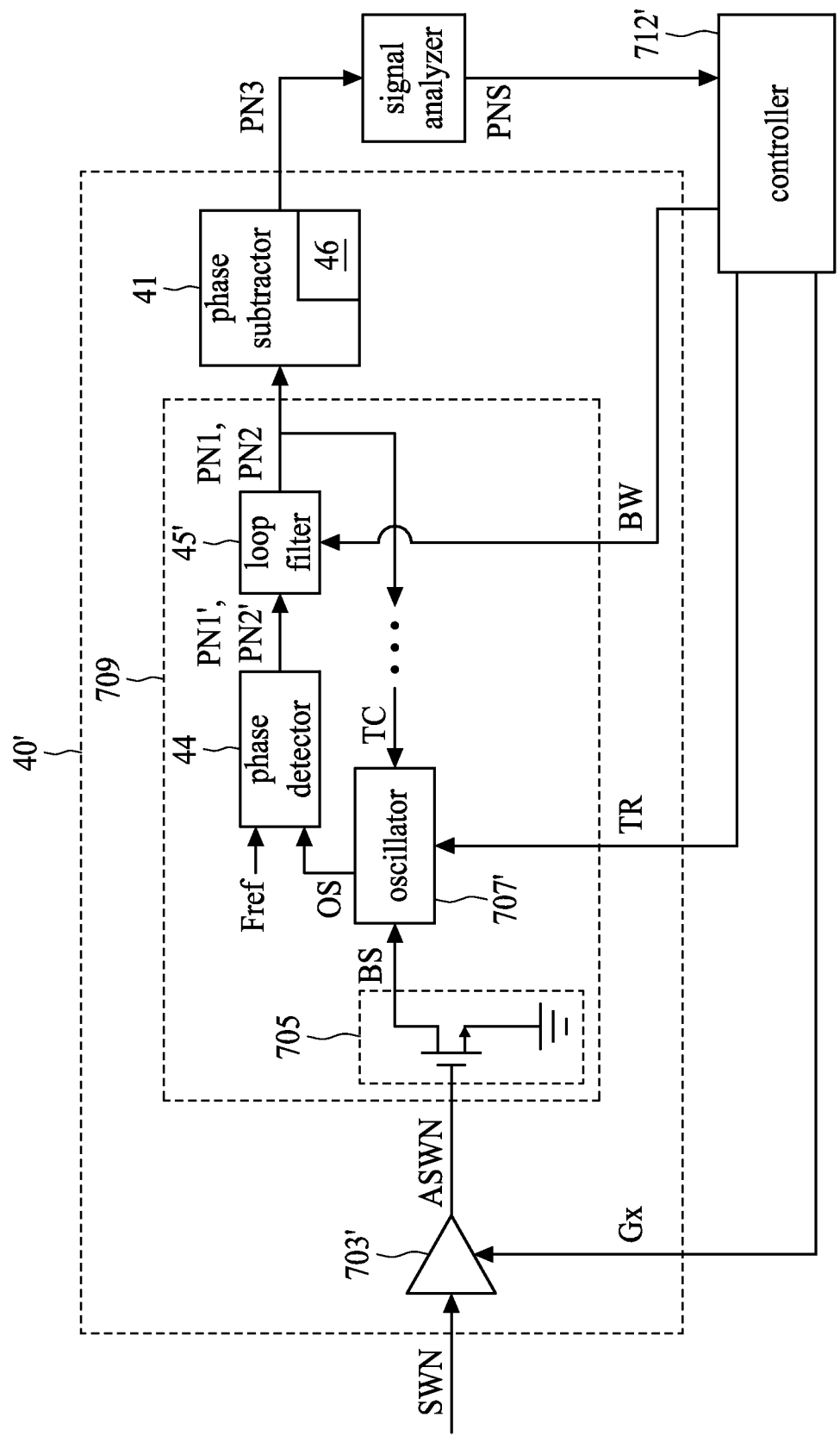
FIG. 5 is a block diagram of the noise-measuring system 40' controlled by the controller 712', in accordance with some embodiments.

FIG. 5 is a block diagram of a noise-measuring system 40' controlled by a controller 712' in accordance with some embodiments. Compared to the noise-measuring system 40 and the controller 712 described with reference to FIG. 2, the controller 712' is further configured to adjust parameters of the noise-measuring system 40' in response to the phase noise PN3 to iteratively adjust the phase noise spectrum PNS (shown in FIG. 1) until a desired phase noise spectrum is obtained. The adjustable parameters of the noise-measuring system 40' include an amplifier gain Gx of an amplifier 703', a tuning range of an oscillator 707' and a filter bandwidth BW of a loop filter 45'. In response to monitored magnitudes of phase noise power of the phase noise spectrum PNS, the controller 712' adjusts the amplifier gain Gx to obtain desired magnitudes of the phase noise power of the phase noise spectrum PNS. In response to whether the turning point 801 (exemplarily shown in FIG. 4) is identified in the phase noise spectrum PNS, the controller 712' adjusts the tuning range TR of the oscillator 707'. In response to the bandwidth of the phase noise spectrum PNS, the controller 712' adjust the filter bandwidth BW of the loop filter 45' to retain the portion of the phase noise spectrum PNS needed to be observed.

Figure 6:
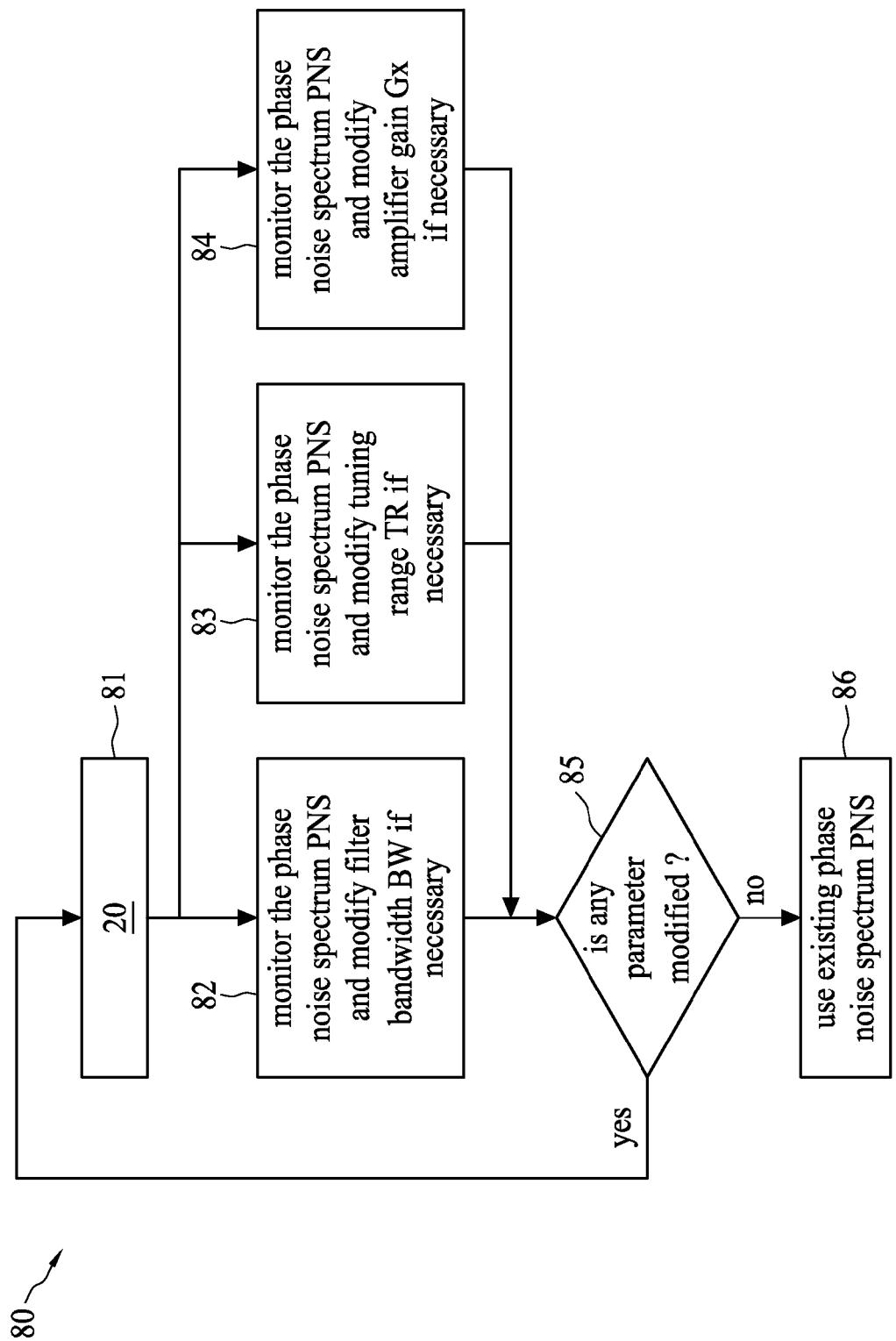
FIG. 6 is an operational flow of a method for monitoring the DUT with some parameters, in accordance with some embodiments.

FIG. 6 is a flow diagram of a method 80 for adjusting parameters of the noise-measuring system 40' in FIG. 5 in accordance with some embodiments. Refer to FIGS. 5 and 6.

In operation 81, the method 20 for obtaining the phase noise spectrum PNS of the DUT 701 described with reference to FIG. 3 is performed. In some embodiments, the method 80 then performs operations 82, 83 and 84 concurrently. In other embodiments, the method 80 performs operations 82, 83 and 84 sequentially.

In operation 82, the controller 712' monitors the phase noise spectrum PNS and modifies the filter bandwidth BW of the loop filter 45' if necessary. In some embodiments, the controller 712' determines whether to modify the filter bandwidth BW based on the portion of the phase noise spectrum PNS needed to be observed.

In operation 83, the controller 712' monitors the phase noise spectrum PNS and modifies the tuning range TR of the oscillator 707' if necessary. In some embodiments, the controller 712' determines whether to modify the tuning range TR based on whether the turning point 801 (exemplarily shown in FIG. 4) is identified in the phase noise spectrum PNS.

In operation 84, the controller 712' monitors the phase noise spectrum PNS and modifies the amplifier gain Gx of the amplifier 703' if necessary. In some embodiments, the controller 712' determines whether to modify the amplifier gain Gx based on whether the magnitudes of the phase noise power of the phase noise spectrum PNS are sufficient for observation.

In operation 85, the controller 712' checks if any parameter is modified. If so, the method 80 loops back to the operation 81 to iteratively perform the method 20. If not, the method 80 proceeds to the operation 86.

In operation 86, the existing phase noise spectrum PNS obtained in the current iteration is accepted to be used.

By allowing the tuning range TR of the oscillator 707 and the filter bandwidth BW of the loop filter 45 to be adjusted, the corner frequency at which the turning point 801 (shown in FIG. 4) of the phase noise spectrum 802 resides can be identified. Therefore, impacts of both the flicker noise and the thermal noise can be observed.

Figure 7:
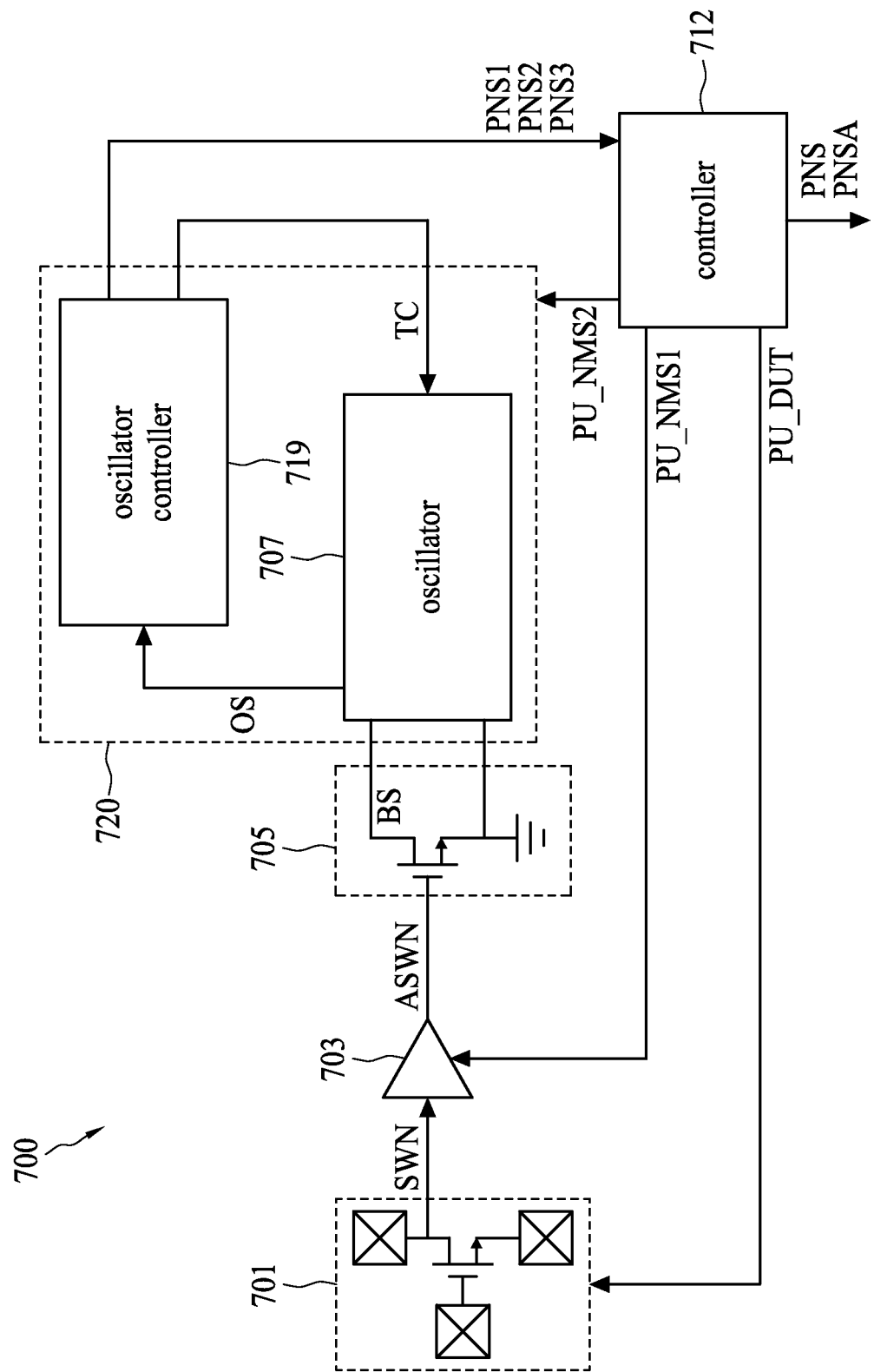
FIG. 7 is a block diagram for obtaining some phase noise spectrum of the DUT, in accordance with some embodiments.

FIG. 7 is a block diagram of a system 700 for obtaining a phase noise spectrum PNS of a device under test (DUT) 701 in accordance with some embodiments. The system 700 includes the DUT 701, an amplifier 703, a modulator 705 and a converter 720. The converter 720 includes an oscillator 707, an oscillator controller 719, and the DUT 701. The controller 712 is configured to turn on/off the converter 720 via signals PU_NMS2, the DUT 701 via a signal PU_DUT, and the amplifier 703 via a signal PU_NMS1. The DUT 701 is configured to generate a signal with noise SWN to the amplifier 703. The amplifier 703 is configured to generate an amplified signal with noise ASWN to the modulator 705. The modulator 705 is configured to generate a bias signal BS to the oscillator 707. The oscillator controller 719 is configured to send a phase noise spectrum PNS1 with the converter 720 turned on, and the DUT 701 and the amplifier 703 kept at an off state. The oscillator controller 719 is configured to send a phase noise spectrum PNS2 with the amplifier 703 and the converter 720 turned on, and the DUT 701 kept at an off state. The oscillator controller 719 is configured to send a phase noise spectrum PNS3 with the DUT 701, the amplifier 703, and the converter 720 turned on. The controller 712 is configured to receive the phase noise spectra PNS1, PNS2, and PNS3 to generate the phase noise spectrum PNS of the device under test (DUT) 701. The phase noise spectrum PNS can be obtained by subtracting PNS2 from PNS3. A phase noise spectrum PNSA of the amplifier 703 is obtained by subtracting PNS1 from PNS2.

In FIG. 7, in some embodiments, for measuring the phase noise spectrum PNS1 caused by the converter 720, the converter 720 is turned on while the DUT 701 and the amplifier 703 are turned off. The modulator 705 outputs the bias signal BS to the oscillator 707. The oscillator 707 is configured to generate an oscillator signal OS in response to the bias signal BS. The oscillator 707 outputs the oscillator signal OS to the oscillator controller 719. Before turning on the DUT 701 and the amplifier 703, the oscillator controller 719 outputs the phase noise spectrum PNS1 to the controller 712.

To measure the phase noise spectrum PNS2 caused by the converter 720 and the amplifier 703, the amplifier 703 is turned on subsequent to the converter 720. After turning on the amplifier 703, the amplifier 703 is configured to generate the amplified signal with noise ASWN. The modulator 705 generates the bias signal BS in response to the amplified signal with noise ASWN. The oscillator 707 generates the oscillator signal OS in response to the bias signal BS. The oscillator 707 outputs the oscillator signal OS to the oscillator controller 719. After turning on the amplifier 703, the oscillator controller 719 outputs the phase noise spectrum PNS2 to the controller 712.

To measure the phase noise spectrum PNS3 caused by the converter 720, the amplifier 703, and the DUT 701, the DUT 701 is turned on subsequent to the converter 720 and the amplifier 703. After turning on the DUT 701, the DUT 701 generates the signal with noise SWN. The amplifier 703 is configured to amplify the signal SWN to update the amplified signal with noise ASWN. The modulator 705 generates the bias signal BS in response to the amplified signal with noise ASWN. The oscillator 707 generates the oscillator signal OS in response to the bias signal BS. The oscillator 707 outputs the oscillator signal OS to the oscillator controller 719. After turning on the DUT 701, the oscillator controller 719 outputs the phase noise spectrum PNS3 to the controller 712.

Figure 8:
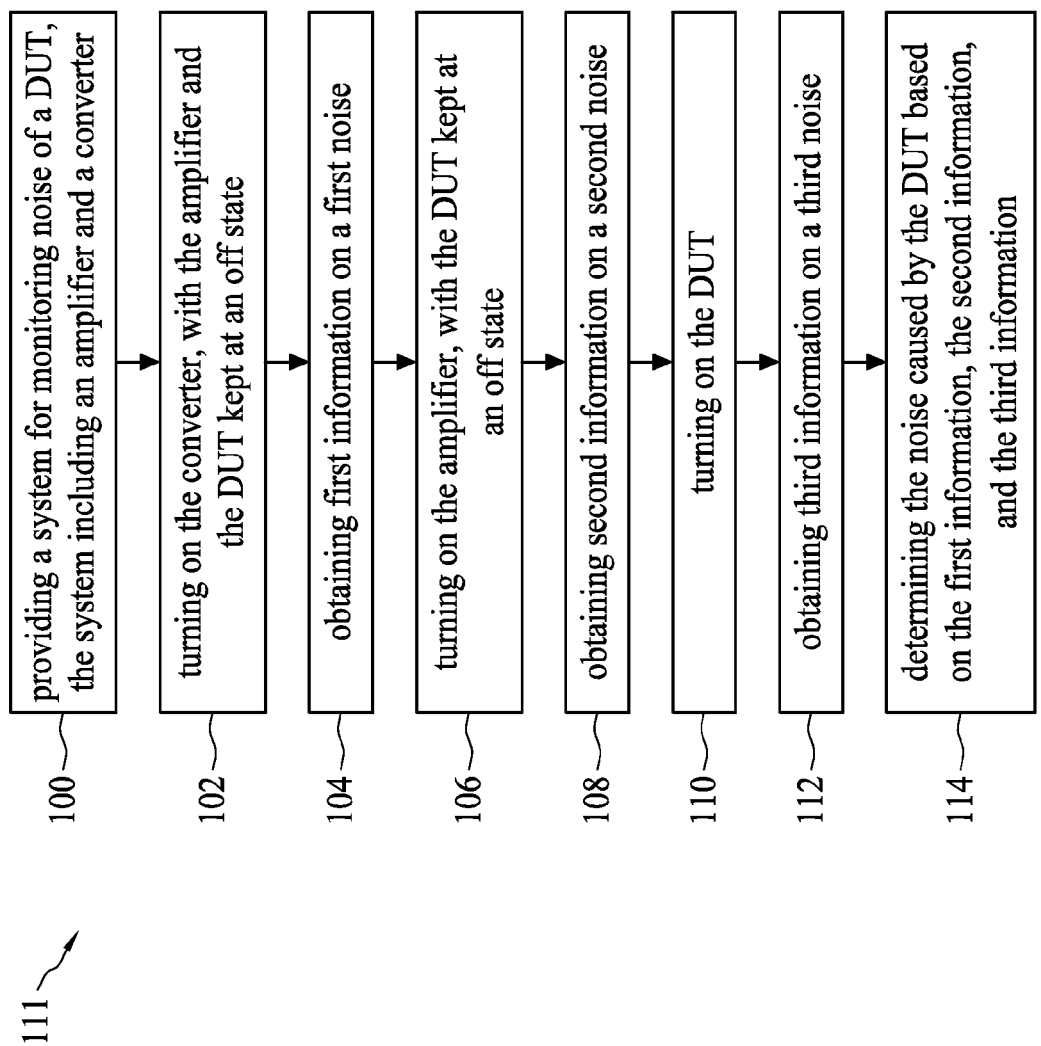
FIG. 8 is a block diagram of the system 700 controlled by the controller 712 in the system in FIG. 7, in accordance with some embodiments.

FIG. 8 is a flow diagram of a method 111 for obtaining the phase noise spectrum PNS of the DUT 701 performed by the system 700 in FIG. 8 in accordance with some embodiments. FIG. 8 illustrates an operation for removing some noises from amplifier 703 and converter 720. Refer to FIGS. 5 to 7.

In operation 100, a system 700 for monitoring a noise of the DUT 701 is provided. The system 700 includes the amplifier 703, the converter 720, and the DUT 701.

In operation 102, the converter 720 is turned on, with the amplifier 703 and DUT 701 kept at an off state. The controller 712 turns on the converter 720 via the signal PU_NMS2.

In operation 104, first information on a first noise caused by the converter 720 is obtained. The first information is also the phase noise spectrum PNS1. The modulator 705 generates the bias signal BS maintained at the substantially constant phase. In response to the bias signal BS, the oscillator 707 generates the oscillator signal OS that has only the phase noise of the oscillator 707 and the oscillator controller 719 in response to the bias signal BS. The oscillator signal OS includes the first noise. In response to the oscillator signal OS, the oscillator controller 719 generates the tuning code TC back to oscillator 707. The frequency of the oscillator signal OS is tuned by the tuning code TC. The oscillator controller 719 generates the phase noise spectrum PNS1 and sends to the controller 712.

In operation 106, the amplifier 703 is turned on, with the DUT 701 kept at an off state. The controller 712 turns on the amplifier 703 via the signal PU_NMS1.

In operation 108, second information on a second noise is obtained. The second information is also the phase noise spectrum PNS2. The system 700 measures the phase noise spectrum PNS2 caused by the amplifier 703 and the converter 720. The amplifier 703 generates the amplified signal with noise ASWN to the modulator 705. The modulator 705 generates the bias signal BS in response to the amplified signal with noise ASWN. In response to the bias signal BS, the oscillator 707 generates the oscillator signal OS that has only the phase noise of the oscillator 707, the oscillator controller 719, and the amplifier 703. The oscillator signal OS includes the second noise. In response to the oscillator signal OS, the oscillator controller 719 generates the tuning code TC back to oscillator 707. The oscillator controller 719 generates the phase noise spectrum PNS2 and sends to the controller 712.

In operation 110, the controller 712 turns on the DUT 701. The controller 712 turns on the DUT 701 via the signal PU_DUT.

In operation 112, third information on a third noise is obtained. The third information is also the phase noise spectrum PNS3. The system 700 measures the phase noise PN3 caused by the converter 720, the amplifier 703, and the DUT 701. The DUT 701 generates the signal with noise SWN. The amplifier 703 amplifies the signal SWN to generate the amplified signal with noise ASWN. The modulator 705 generates the bias signal BS in response to the amplified signal with noise ASWN. The oscillator 707 generates the oscillator signal OS in response to the bias signal BS and the tuning code TC. The oscillator signal OS includes the third noise. In response to the oscillator signal OS, the oscillator controller 719 generates the tuning code TC back to oscillator 707. The oscillator controller 719 generates the phase noise spectrum PNS3 and sends to the controller 712.

In operation 114, a noise caused by the DUT is determined based on the first information, the second information, and the third information. The noise caused by the DUT 701 is also the phase noise spectrum PNS caused by the DUT 701. The controller 712 subtracts the phase noise spectrum PNS2 from the phase noise spectrum PNS3 to obtain the phase noise spectrum PNS caused by the DUT 701. The phase noise spectrum PNS is exemplarily shown in FIG. 9. Thus, measuring of the DUT 701 by system 700 to reduce the noise cause by the system 700 is improved, thereby increases accuracy of the measurement.

Figure 10:
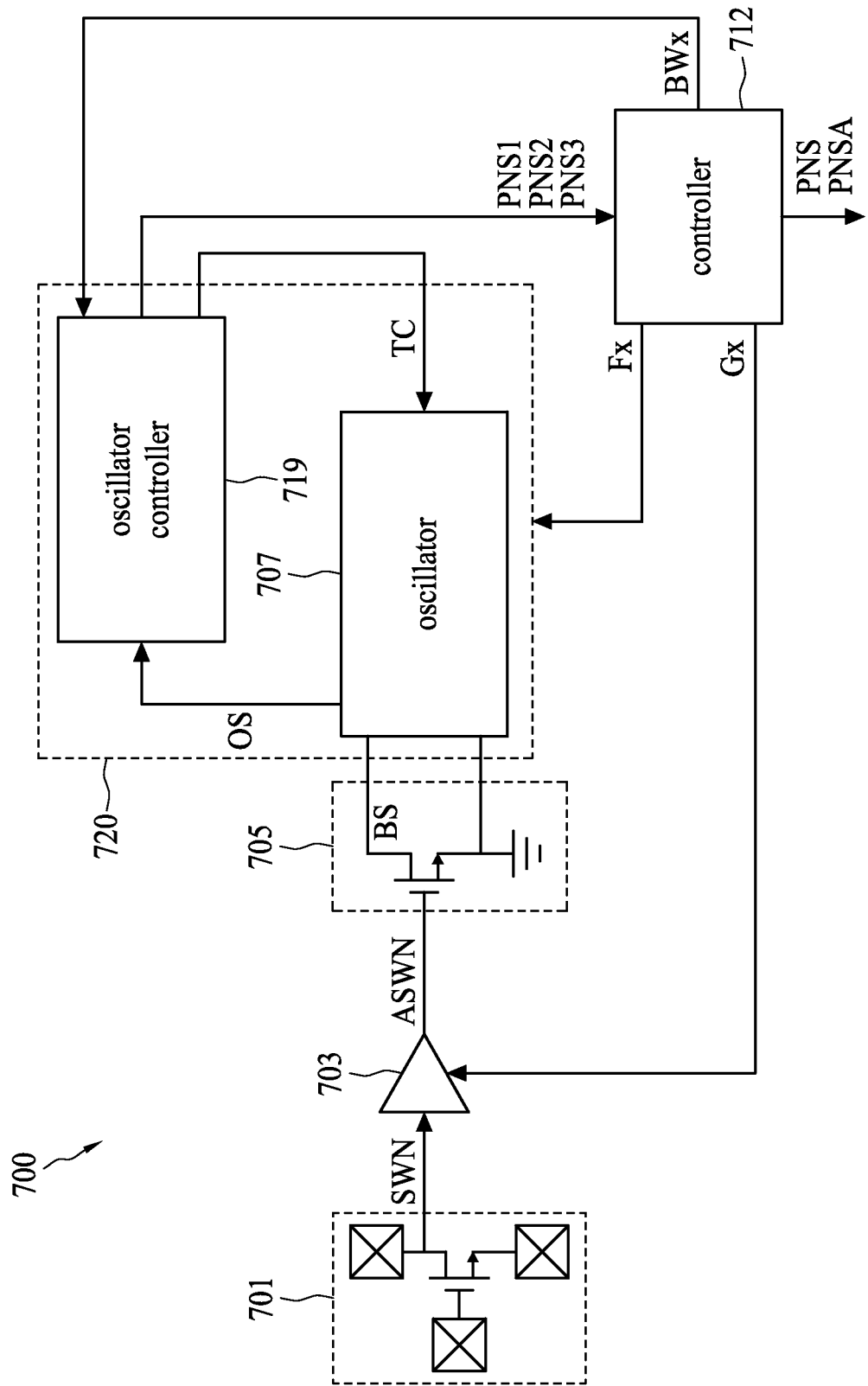
FIG. 10 is a diagram illustrating phase noise spectra of the phase noise of the system and the DUT, in accordance with some embodiments.

FIG. 10 is a block diagram of the system 700 controlled by the controller 712 in accordance with some embodiments. The controller 712 is configured to adjust parameters of the system 700 in response to the phase noise spectrum PNS to repeatedly adjust the phase noise spectrum PNS (shown in FIG. 7) until a desired phase noise spectrum is obtained. The adjustable parameters of the system 700 include an amplifier gain Gx of the amplifier 703, a frequency Fx of the converter 720 and a filter bandwidth BWx of the oscillator controller 719. In response to monitored magnitudes of phase noise power of the phase noise spectrum PNS, the controller 712 adjusts the amplifier gain Gx to obtain desired magnitudes of the phase noise power of the phase noise spectrum PNS. In response to a change in a carrier frequency applied to the DUT 701, the controller 712 adjusts the frequency Fx of the converter 720. In response to the bandwidth of the phase noise spectrum PNS, the controller 712 adjust the filter bandwidth BW of the oscillator controller 719 to retain the portion of the phase noise spectrum PNS needed to be observed. By allowing the converter 720, modulator 705, and the amplifier 703 to be placed on a same chip or on a same wafer along with the DUT 701, the phase noise spectrum 802 can be identified in a massive scale. Therefore, efficiency of both the measuring and a testing on the DUT 701 is improved.

Figure 9:
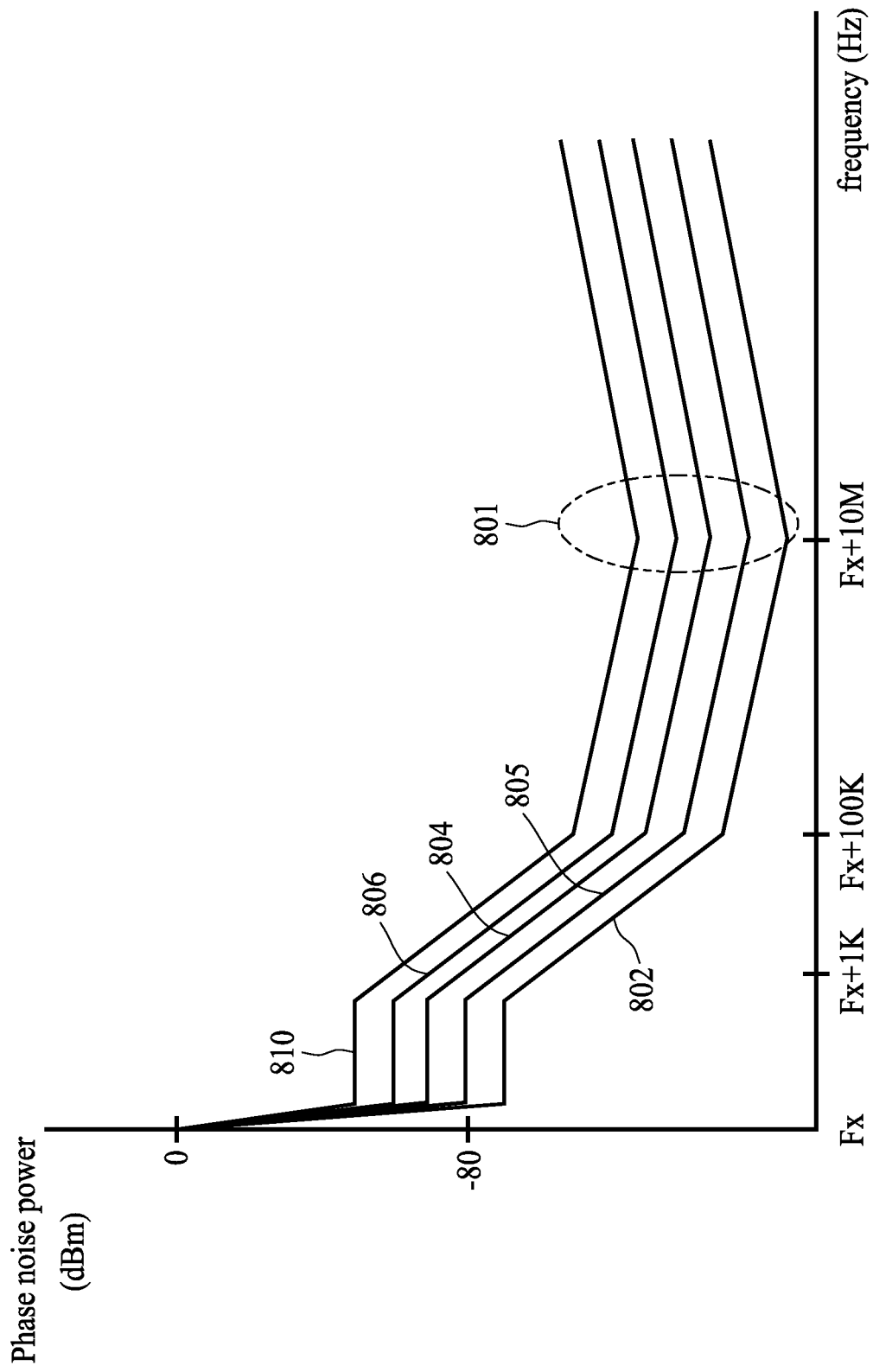
FIG. 9 is a flow diagram of a method for obtaining the phase noise spectrum of the DUT performed by the system in FIG. 7, in accordance with some embodiments.

FIG. 9 is a diagram illustrating phase noise spectra of the system 700 in accordance with some embodiments. Referring to FIGS. 7, 8 and 9, the phase noise spectrum PNS generated by the controller 712 is the phase noise spectrum 802. The phase noise spectrum PNS is extracted from the phase noise spectrum PNS3 and the phase noise spectrum PNS2. The phase noise spectrum 806 is the phase noise spectrum PNS2, and the phase noise spectrum 810 is the phase noise spectrum PNS3 as shown in FIG. 9. The phase noise spectrum 806 with only the converter 720 and the amplifier 703 turned on has smaller magnitudes of phase noise power compared to the phase noise spectrum 810 with the converter 720, the amplifier 703, and the DUT 701 turned on. After the phase noise spectrum PNS2 is eliminated from the phase noise spectrum PNS3, the phase noise spectrum 802, which is the phase noise spectrum PNS, has only the phase noise power of the DUT 701 remain and has significantly lower magnitudes. The phase noise spectrum PNSA of the amplifier 703 is extracted from the phase noise spectrum PNS2 and the phase noise spectrum PNS1. The phase noise spectrum 806 is the phase noise spectrum PNS2, and the phase noise spectrum 804 is the phase noise spectrum PNS1 as shown in FIG. 9. The phase noise spectrum 806 with the converter 720 and the amplifier 703 turned on has larger magnitudes of phase noise power compared to the phase noise spectrum 804 with only the converter 720 turned on. After the phase noise spectrum PNS1 is eliminated from the phase noise spectrum PNS2, the phase noise spectrum 805, which is the phase noise spectrum PNSA, has only the phase noise power of the amplifier 703 remains and has lower magnitudes.

Figure 11:
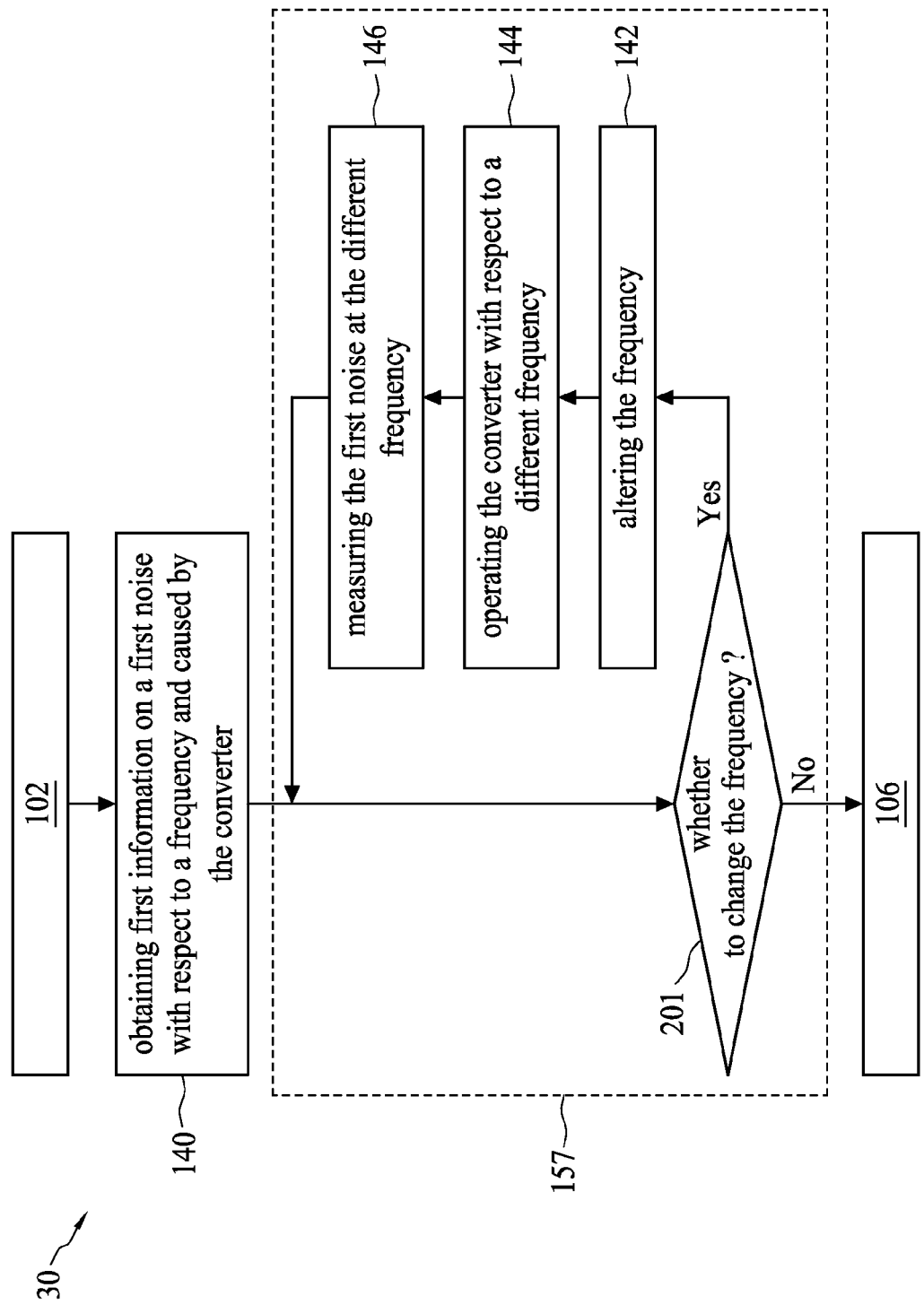
FIG. 11 is an operational flow of a method for monitoring the DUT with some parameters, in accordance with some embodiments.

FIGS. 11 to 14 are flow diagrams respectively illustrating methods 30, 31, 32 and 33 corresponding to sections in the method 111 in FIG. 8 for in-line adjustment of parameters of the system 700 in FIG. 10 in accordance with some embodiments. Compared the method 80 in FIG. 6 which performs parameter adjustments after noise-measurement is performed, the methods 30, 31, 32, and 33 are performed during the process of noise measurement in FIG. 10. FIG. 11 is illustrating the method 30 for adjusting the frequency Fx of the system 700. Refer to FIGS. 8, 9 10 and 11.

The operation 102 for turning on the converter 720, with the amplifier 703 and the DUT 701 kept at an off state in FIG. 10 is performed. In some embodiments, the method 30 then performs operations 201, 142, 144, and 146 sequentially and repeatedly in a loop 157 and then performs the operation 106 upon exiting the loop 157.

In operation 140, the controller 712 obtains first information on the first noise with respect to a frequency. The first noise is caused by the converter 720. The first information is also the phase noise spectrum PNS1.

In operation 201, in some embodiments, the controller 712 determines whether to change the frequency Fx based on the portion of the phase noise spectrum PNS1 needed to be observed.

In operation 142, the controller 712 obtains the phase noise spectrum PNS1 and changes the frequency of the converter 720 if necessary.

In operation 144, the converter 720 is operated with respect to a different frequency.

In operation 146, the controller 712 measures first information on the first noise with respect to the different frequency. The method 30 proceeds to perform the operation 201 again.

In the operation 201, The controller 712 checks if the different frequency matches with the carrier frequency for the first noise to be observed with respect to the operation 201. If so, the method 30 proceeds to the operation 106 in which turning on the amplifier 703, with the DUT 701 kept at an off state in FIG. 10 is performed. If not, the method 30 loops back to the operation 142 to iteratively perform the operations 142, 144, and 146.

Figure 12:
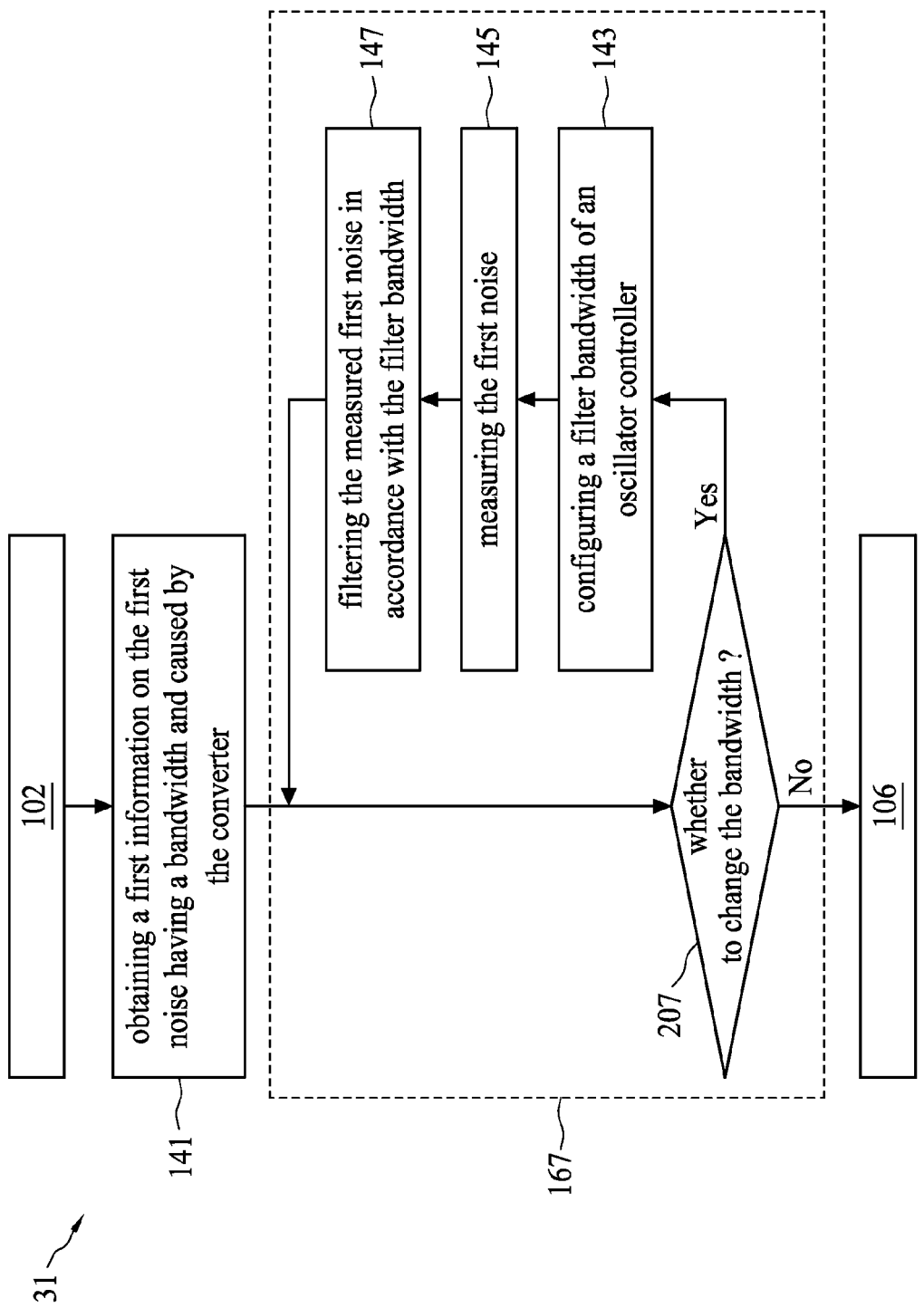
FIG. 12 is an operational flow of a method for monitoring the DUT with some parameters, in accordance with some embodiments.

FIG. 12 is illustrating the method 31 for adjusting the filter bandwidth BWx of the system 700. Refer to FIGS. 8, 9 10 and 12.

The operation 102 for turning on the converter 720, with the amplifier 703 and the DUT 701 kept at an off state in FIG. 10 is performed. In some embodiments, the method 31 then performs operations 207, 143, 145, and 147 sequentially and repeatedly in a loop 167 and then performs the operation 106 upon exiting the loop 167.

In operation 141, the controller 712 obtains first information on the first noise having a bandwidth. The first noise is caused by the converter 720. The first information is also the phase noise spectrum PNS1.

In operation 207, in some embodiments, the controller 712 determines whether to change the filter bandwidth BWx based on the portion of the phase noise spectrum PNS1 needed to be observed.

In operation 143, the controller 712 obtains the phase noise spectrum PNS1 and configures the filter bandwidth BWx of the oscillator controller 719 if necessary.

In operation 145, the controller 712 measures the first noise.

In operation 147, the oscillator controller 719 filters the measured first noise in accordance with the filter bandwidth BWx.

In the operation 207, the controller 712 checks if the filter bandwidth BWx covers the portion of the phase noise spectrum PNS1 needed to be observed. If so, the method 31 proceeds to the operation 106 in which turning on the amplifier 703, with the DUT 701 kept at an off state in FIG. 10 is performed. If not, the method 31 loops back to the operation 143 to iteratively perform the operations 143, 145, and 147.

Figure 13:
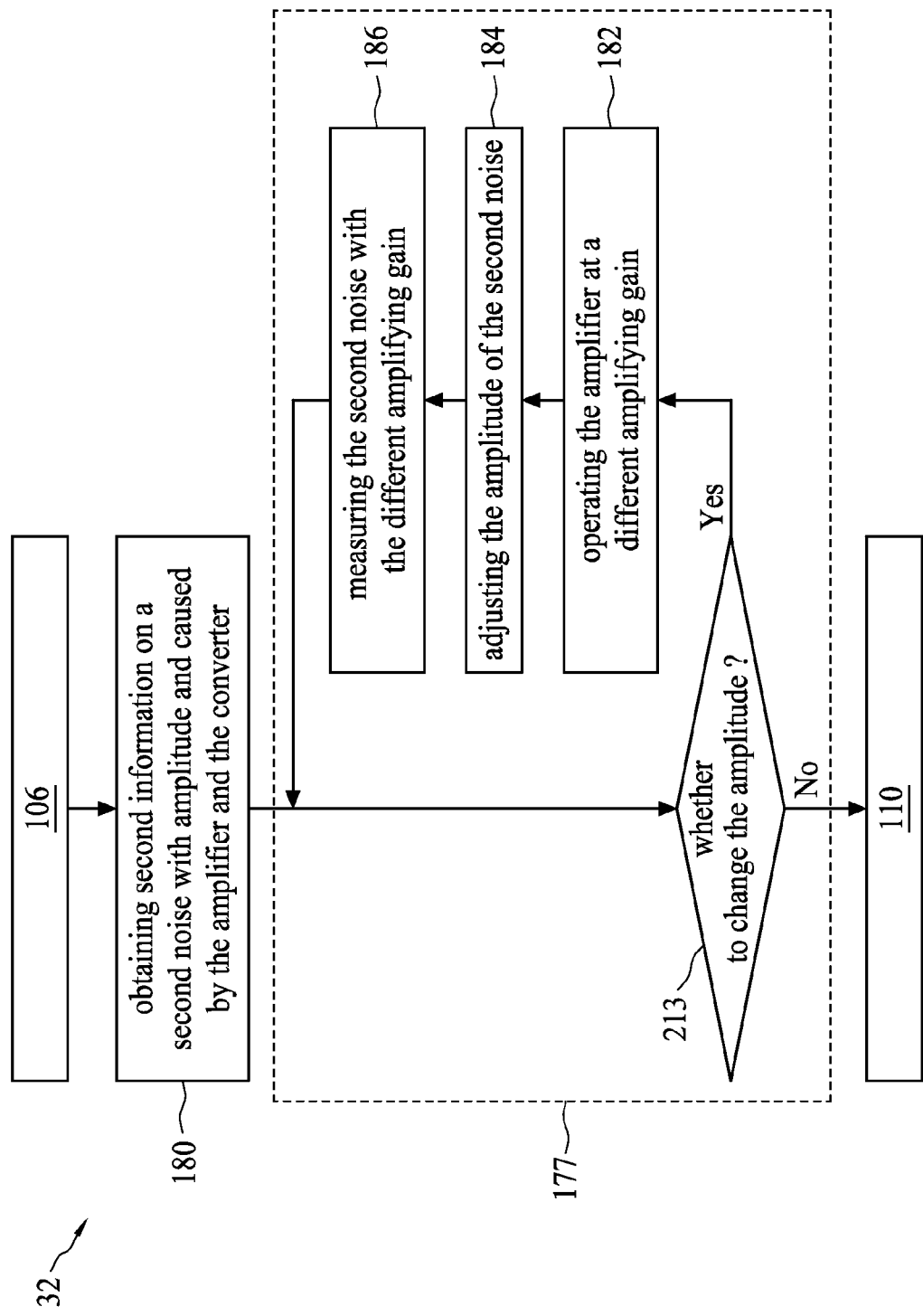
FIG. 13 is an operational flow of a method for monitoring the DUT with some parameters, in accordance with some embodiments.

FIG. 13 is illustrating the method 32 for adjusting the amplifying gain Gx of the system 700. Refer to FIGS. 8, 9 10 and 13.

The operation 106 for turning on the amplifier 703, with the DUT 701 kept at an off state in FIG. 10 is performed. In some embodiments, the method 32 then performs operations 213, 182, 184, and 186 sequentially and repeatedly in a loop 177 and then performs the operation 110 upon exiting the loop 177.

In operation 180, the controller 712 obtains second information on the second noise with amplitude. The second noise is caused by the amplifier 703 and the converter 720. The second information is also the phase noise spectrum PNS2.

In operation 213, in some embodiments, the controller 712 determines whether to change the amplitude by amplifying gain Gx based on the portion of the phase noise spectrum PNS2 needed to be observed.

In operation 182, the controller 712 obtains the phase noise spectrum PNS2 and the amplifier 703 is operated at a different amplifying gain Gx if necessary.

In operation 184, the amplifier 703 adjusts the amplitude of the second noise.

In the operation 186, the controller 712 checks if the magnitudes of the phase noise power of the phase noise spectrum PNS2 are sufficient for observation. If so, the method 32 proceeds to the operation 110 in which turning on the DUT 701 is performed. If not, the method 32 loops back to the operation 182 to iteratively perform the operations 182, 184, and 186.

Figure 14:
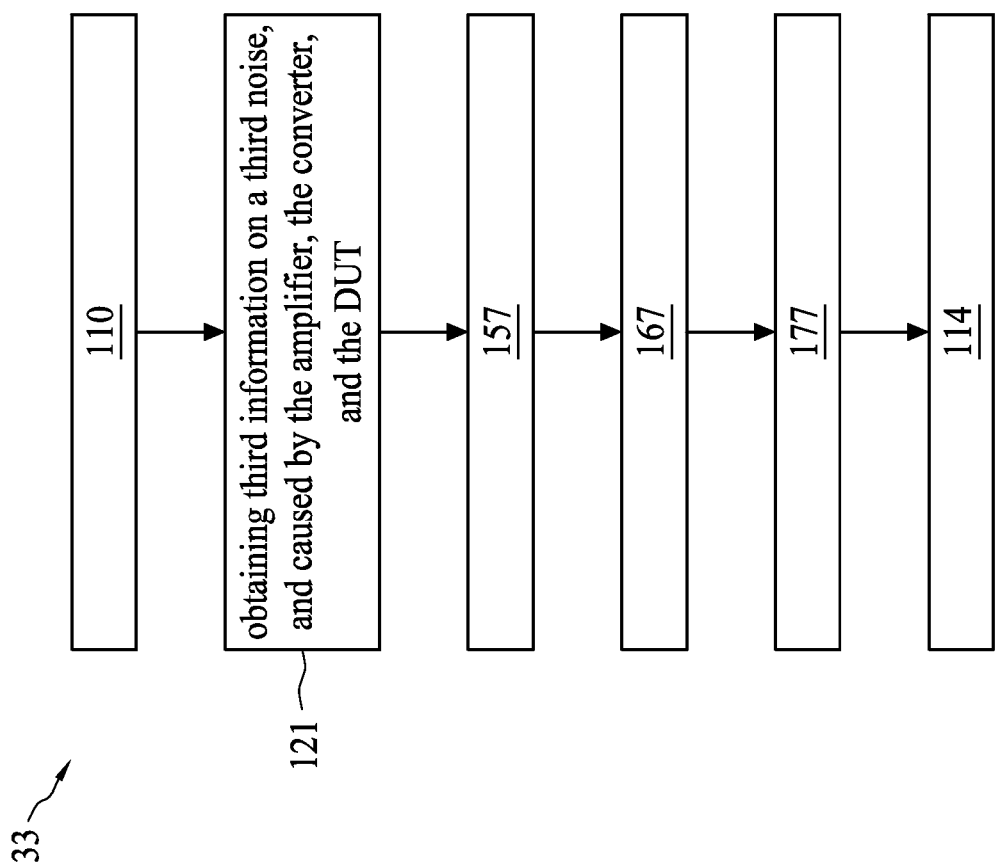
FIG. 14 is an operational flow of a method for monitoring the DUT with some parameters, in accordance with some embodiments.

FIG. 14 is illustrating the method 33 for adjusting the frequency Fx, the filter bandwidth BWx, and the amplifying gain Gx of the system 700. Refer to FIGS. 8, 109 and 14.

The operation 110 for turning on the DUT 701 in FIG. 8 is performed. In some embodiments, the method 33 then performs operations 121, 157, 167, 177 and 114 sequentially.

In operation 121, the controller 712 obtains third information on the third noise with respect to the frequency, having the bandwidth, and with the amplitude. The third noise is caused by the amplifier 703, the converter 720, and the DUT 701. The third information is also the phase noise spectrum PNS3.

The loop 157 for tuning the frequency Fx based on the portion of the phase noise spectrum PNS3 needed to be observed in FIG. 11 is performed. The operation 157 in FIG. 11 and in FIG. 14 are similar except in FIG. 11, the tuning is based on the portion of the phase noise spectrum PNS1, whereas in FIG. 14, the tuning is based on the portion of the phase noise spectrum PNS3.

The loop 167 for tuning the filter bandwidth BWx based on the portion of the phase noise spectrum PNS3 needed to be observed in FIG. 12 is performed. The operation 167 in FIG. 11 and in FIG. 14 are similar except in FIG. 12, the tuning is based on the portion of the phase noise spectrum PNS1, whereas in FIG. 14, the tuning is based on the portion of the phase noise spectrum PNS3.

The loop 177 for changing the amplifying gain Gx based on the portion of the phase noise spectrum PNS3 needed to be observed in FIG. 13 is performed. The operation 177 in FIG. 13 and in FIG. 14 are similar except in FIG. 13, the changing is based on the portion of the phase noise spectrum PNS2, whereas in FIG. 14, the tuning is based on the portion of the phase noise spectrum PNS3.

The controller 712 checks if the frequency Fx, the filter bandwidth BWx, and the amplifying gain Gx are modified in the loop 157, the loop 167, and the loop 177, based on the portion of the phase noise spectrum PNS3 needed to be observed.

The operation 114 for determining the noise caused by the DUT based on the first information, the second information, and the third information in FIG. 8 is performed. The noise cause by the DUT is also the phase noise signal PNS of the DUT 701.

By allowing the frequency Fx of the converter 720 to be adjusted, the carrier frequency of the phase noise spectrum 810, 806, and 804 can be identified using the in-line adjustment.

Some embodiments have one or a combination of the following features and/or advantages. In some embodiments, a first phase noise measured with a noise-measuring system turned on and a DUT turned off is subtracted from a second phase noise measured with both the noise-measuring system and the DUT turned on to obtain a phase noise spectrum. Therefore, over-design of the DUT or a circuit employing the DUT to overcome interference of noise resulted from process corner variation is improved, thereby reducing chip area. In other embodiments, in response to the magnitudes of phase noise power of the phase noise, whether a corner frequency is identified in the phase noise spectrum or whether a bandwidth of the phase noise spectrum is sufficient for observation, parameters of the noise-measuring system are adjusted. Therefore, impacts of both the flicker noise and the thermal noise on the DUT can be observed.

Some embodiments of the present disclosure provide a method including turning on a noise-measuring system for a device under test (DUT) with the DUT turned off; measuring a first phase noise caused by the noise-measuring system; turning on the DUT; measuring a second phase noise caused by the noise-measuring system and the DUT; and subtracting the first phase noise from the second phase noise to obtain a third phase noise caused by the DUT.

Some embodiments of the present disclosure provide a system for obtaining a fourth phase noise caused by a device under test (DUT), including a noise-measuring system configured to measure the fourth phase noise caused by the DUT; and a controller configured to turn on the noise-measuring system with the DUT turned off to cause the noise-measuring system to measure a fifth noise caused by the noise-measuring system, and turn on the DUT to cause the noise-measuring system to measure a sixth noise caused by the noise-measuring system and the DUT, and subtract the fifth phase noise from the sixth phase noise to obtain the fourth phase noise caused by the DUT.

Some embodiments of the present disclosure provide a method including turning on a phase lock loop (PLL) and a phase subtractor for measuring a seventh phase noise of a device under test (DUT), and not turning on the DUT; the PLL measuring an eighth phase noise caused by the PLL; turning on the DUT; the PLL measuring a ninth phase noise caused by the PLL and the DUT; and the phase subtractor subtracting the eighth phase noise from the ninth phase noise to obtain the seventh phase noise caused by the DUT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
turning on a noise-measuring system for a device under test (DUT) with the DUT turned off;
measuring a first phase noise caused by the noise-measuring system;
turning on the DUT;
measuring a second phase noise caused by the noise-measuring system and the DUT; and
subtracting the first phase noise from the second phase noise to obtain a third phase noise caused by the DUT.

2. The method of claim 1, wherein the operation of turning on the noise-measuring system comprises:
turning on the noise-measuring system comprising a phase lock loop (PLL), the PLL comprising:
a bias-modulated oscillator configured to generate an oscillator signal tuned in response to a bias signal, and
a phase detector configured to detect a phase noise of the oscillator signal with respect to a reference signal, the phase noise resulting in the first phase noise or the second phase noise.

3. The method of claim 2, wherein the operation of measuring the first phase noise comprises:
the bias-modulated oscillator generating the bias signal maintained at a substantially constant phase;
the bias-modulated oscillator generating the oscillator signal in response to the bias signal; and the phase detector detecting the first phase noise which exists in the oscillator signal with respect to the reference signal.

4. The method of claim 2, wherein the operation of turning on the DUT comprises:
the DUT generating a signal with noise.

5. The method of claim 4, wherein the operation of measuring the second phase noise comprises:
the bias-modulated oscillator causing the bias signal to be generated in response to the signal with noise of the DUT;
the bias-modulated oscillator generating the oscillator signal in response to the bias signal; and
the phase detector detecting the second phase noise which exists in the oscillator signal with respect to the reference signal.

6. The method of claim 5, wherein the operation of turning on the noise-measuring system further comprises:
turning on the noise-measuring system further comprising an amplifier, the amplifier configured to amplify the signal with noise before the bias-modulated oscillator causes the bias signal to be generated in response to the signal with noise of the DUT.

7. The method of claim 2, the operation of turning on the noise-measuring system further comprises:
turning on the noise-measuring system further comprising a phase subtractor and a storage element,
the storage element configured to store the first phase noise received from the phase detector, and
the phase subtractor configured to receive the first phase noise from the storage element and the second phase noise from the phase detector and generate the third phase noise.

8. The method of claim 7, wherein the operation of subtracting the second phase noise from the third phase noise comprises:
the phase subtractor performing phase subtraction on the second phase noise and the first phase noise to obtain the third phase noise of the DUT.

9. A system for obtaining a phase noise caused by a device under test (DUT), comprising:
a noise-measuring system configured to measure the phase noise caused by the DUT; and
a controller configured to:
turn on the noise-measuring system with the DUT turned off to cause the noise-measuring system to measure a first phase noise caused by the noise-measuring system, and
turn on the DUT to cause the noise-measuring system to measure a second phase noise caused by the noise-measuring system and the DUT, and subtract the first phase noise from the second phase noise to obtain the phase noise caused by the DUT.

10. The system of claim 9, wherein the noise-measuring system comprises a phase lock loop (PLL), the PLL comprising:
a bias-modulated oscillator configured to generate an oscillator signal tuned in response to a bias signal, and
a phase detector configured to detect a phase noise of the oscillator signal with respect to a reference signal, the phase noise of the oscillator signal being the unfiltered first phase noise, or the unfiltered second phase noise.

11. The system of claim 10, wherein when the controller turns on the noise-measuring system with the DUT turned off,
the bias-modulated oscillator generates the bias signal maintained at a substantially constant phase,
the bias-modulated oscillator generates the oscillator signal in response to the bias signal, and
the phase detector detects the unfiltered first phase noise which exists in the oscillator signal with respect to the reference signal.

12. The system of claim 10, wherein when the controller turns on the DUT,
the DUT generates a signal with noise,
the bias-modulated oscillator causes the bias signal to be generated in response to the signal with noise of the DUT,
the bias-modulated oscillator generates the oscillator signal in response to the bias signal, and
the phase detector detects the unfiltered second phase noise which exists in the oscillator signal with respect to the reference signal.

13. The system of claim 12, wherein the noise-measuring system further comprises an amplifier, and when the controller turns on the noise-measuring system,
the amplifier amplifies the signal with noise of the DUT before the bias-modulated oscillator causes the bias signal to be generated in response to the amplified signal with noise of the DUT.

14. The system of claim 10, wherein the noise-measuring system further comprises a phase subtractor and a storage element,
the storage element configured to store the first phase noise received from the phase detector, and
the phase subtractor configured to receive the first phase noise from the storage element and the second phase noise from the phase detector and generate the phase noise.

15. The system of claim 14, wherein when the controller turns on the DUT, the phase subtractor performs phase subtraction on the second phase noise and the first phase noise to obtain the phase noise of the DUT.

16. A method, comprising:
turning on a phase lock loop (PLL) and a phase subtractor for measuring a phase noise of a device under test (DUT), and not turning on the DUT;
the PLL measuring a first phase noise caused by the PLL;
turning on the DUT;
the PLL measuring a second phase noise caused by the PLL and the DUT; and
the phase subtractor subtracting the first phase noise from the second phase noise to obtain the phase noise caused by the DUT.

17. The method of claim 16, wherein the PLL comprises a bias-modulated oscillator and a phase detector;
the operation of measuring the first phase noise comprises:
the bias-modulated oscillator generating a bias signal maintained at a substantially constant phase;
the bias-modulated oscillator generating an oscillator signal in response to the bias signal; and
the phase detector detecting the unfiltered first phase noise which exists in the oscillator signal with respect to a reference signal.

18. The method of claim 16, wherein the operation of turning on the DUT comprises:
the DUT generating a signal with noise.

19. The method of claim 18, wherein the PLL comprises a bias-modulated oscillator and a phase detector;
the operation of measuring the second phase noise comprising:

the bias-modulated oscillator causing the bias signal to be generated in response to the signal with noise of the DUT;

the bias-modulated oscillator generating the oscillator signal in response to the bias signal; and the phase detector detecting the unfiltered second phase noise which exists in the oscillator signal with respect to a reference signal.

20. The method of claim 19, further comprising:

turning on an amplifier; and the amplifier amplifying the signal with noise of the DUT before the bias-modulated oscillator causes the bias signal to be generated in response to the amplified signal with noise of the DUT.

* * * * *